US008904101B2

(12) United States Patent
Shoham et al.

(10) Patent No.: US 8,904,101 B2
(45) Date of Patent: Dec. 2, 2014

(54) CONTENT-ADDRESSABLE MEMORY LOOKUP DEVICE SUPPORTING ITERATIVE LOOKUP OPERATIONS

(75) Inventors: Doron Shoham, Shoham (IL); Ilan Lisha, Hadera (IL); Yossi Socoletzky, Hadera (IL)

(73) Assignee: Cisco Technology, Inc., San Jose, CA (US)

( * ) Notice: Subject to any disclaimer, the term of this patent is extended or adjusted under 35 U.S.C. 154(b) by 293 days.

(21) Appl. No.: 13/594,827

(22) Filed: Aug. 26, 2012

(65) Prior Publication Data

US 2014/0059289 A1 Feb. 27, 2014

(51) Int. Cl.
*G06F 12/00* (2006.01)
(52) U.S. Cl.
USPC ............. 711/108; 711/E12.069; 711/E12.001
(58) Field of Classification Search
USPC .......................................................... 711/108
See application file for complete search history.

(56) References Cited

U.S. PATENT DOCUMENTS 5,841,679 A * 11/1998 Miura et al. ................. 708/207
2011/0119440 A1* 5/2011 Pandya ......................... 711/105

* cited by examiner

*Primary Examiner* — Yaima Rigol
*Assistant Examiner* — Hamdy S Ahmed
(74) *Attorney, Agent, or Firm* — The Law Office of Kirk D. Williams

(57) ABSTRACT

In one embodiment, multiple content-addressable memory entries are associated with each other to effectively form a batch content-addressable memory entry that spans multiple physical entries of the content-addressable memory device. To match against this content-addressable memory entry, multiple lookup operations are required—i.e., one lookup operation for each combined physical entry. Further, one embodiment provides that a batch content-addressable memory entry can span one, two, three, or more physical content-addressable memory entries, and batch content-addressable memory entries of varying sizes could be programmed into a single content-addressable memory device. Thus, a lookup operation might take two lookup iterations on the physical entries of the content-addressable memory device, with a next lookup operation taking a different number of lookup iterations (e.g., one, three or more).

20 Claims, 6 Drawing Sheets

CONTENT-ADDRESSABLE MEMORY LOOKUP DEVICE SUPPORTING ITERATIVE LOOKUP OPERATIONS

TECHNICAL FIELD

The present disclosure relates generally to content-addressable memory devices, such as, but not limited to, those used in forwarding packets in a communications network.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology.

Content-addressable memories (CAMs), including, but not limited to, binary content-addressable memories (binary CAMs) and ternary content-addressable memories (ternary CAMs or TCAMs) are often used in packet switching device in processing of packets. Each entry of a binary CAM typically includes a value for matching against, while each TCAM entry typically includes a value and a mask. The binary or ternary CAM compares a lookup word against all of the entries in parallel, and typically generates an indication of the highest priority entry that matches the lookup word. An entry matches the lookup word in a binary CAM if the lookup word and the entry value are identical, while an entry matches the lookup word in a TCAM if the lookup word and the entry value are identical in the bits that are not indicated by the mask as being irrelevant to the comparison operations.

BRIEF DESCRIPTION OF THE DRAWINGS

The appended claims set forth the features of one or more embodiments with particularity. The embodiment(s), together with its advantages, may be best understood from the following detailed description taken in conjunction with the accompanying drawings of which:

DESCRIPTION OF EXAMPLE EMBODIMENTS

1. Overview

Figure 1A:
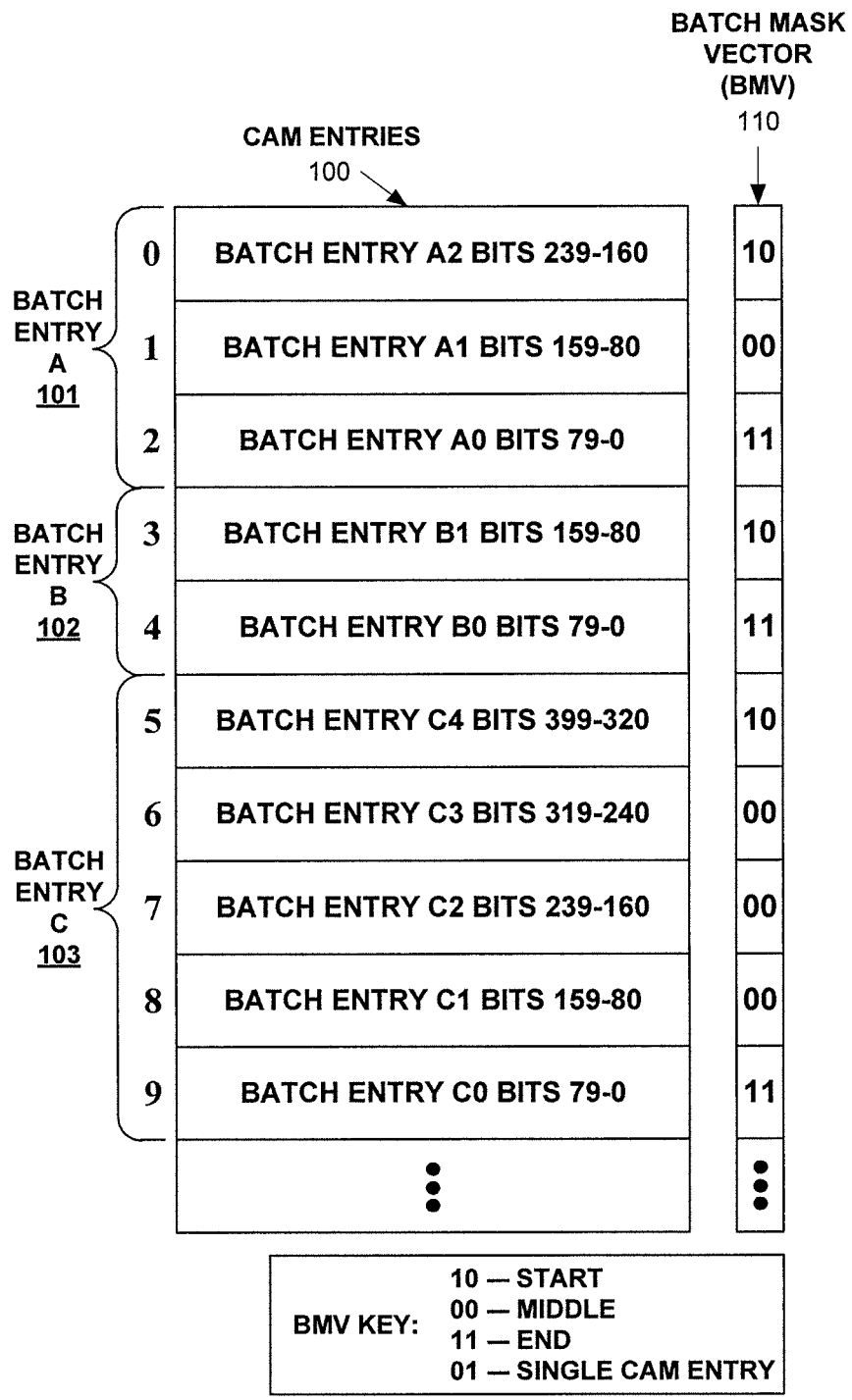
FIG. 1A illustrates content-addressable memory entries according to one embodiment.

Disclosed are, inter alia, methods, apparatus, computer-storage media, mechanisms, and means associated with content-addressable memory lookup device supporting iterative lookup operations.

One embodiment includes performing one or more of iterations of lookup operations, based on a lookup word, on a plurality of content-addressable memory entries to identify an overall lookup result. In one embodiment, performing these one or more of iterations of lookup operations includes: performing a lookup operation on bits of the lookup word corresponding to the current iteration on the plurality of content-addressable memory entries to identify a native result for each of the plurality of content-addressable memory entries; determining which of the native results correspond to a match and which of the native results correspond to a non-match in the current iteration based on a batch mask vector and also, for a non-first iteration, on previous cumulative results. In one embodiment, the batch mask vector identifies for each particular entry of the plurality of content-addressable memory entries a lookup iteration to which said particular entry corresponds.

One embodiment includes an apparatus, comprising: a plurality of content-addressable memory entries; a batch mask vector configured to identify for each particular entry of the plurality of content-addressable memory entries a lookup iteration to which said particular entry corresponds; a cumulative result vector configured to maintain a current cumulative snapshot of lookup results of one or more prior lookup iterations on the plurality of content-addressable memory entries; and match logic configured to determine an overall lookup result based on one or more iterations of lookup operations, based on a lookup word, on the plurality of content addressable memory entries. In one embodiment, this configuration to determine the overall lookup result includes: configuration to cause a lookup operation to be performed, based on bits of the lookup word corresponding to the current iteration, on the plurality of content-addressable memory entries to identify a native result for each of the plurality of content-addressable memory entries; configuration to determine which of the native results correspond to a match and which of the native results correspond to a non-match in the current iteration based on a batch mask vector and also, for a non-first iteration, on the cumulative result vector; and configuration to update the cumulative result vector with said determination of which of the native results correspond to a match and which of the native results correspond to a non-match.

2. Description

Disclosed are, inter alia, methods, apparatus, computer-storage media, mechanisms, and means associated with content-addressable memory lookup device supporting iterative lookup operations. Each entry of a content-addressable memory (CAM) has a limited number of bits against which a bit of a lookup word is matched. The width of a CAM is typically either sized to meet the needs of the application, or what is commercially available as a device or library design. When a CAM is used for multiple purposes, the required width of CAM entries for each application may be different. In the past, a CAM would be selected with a width of each of its entries able to accommodate an entry required for each application. Thus, if the disparity in width requirements were great, a large number of bits in CAM entries would go unused.

To overcome drawbacks of prior approaches, one embodiment provides for multiple CAM entries to be associated with each other to effectively form a batch CAM entry that spans multiple physical entries of the CAM device. To match against this CAM entry, multiple lookup operations are required—i.e., one lookup operation for each combined physical entry. Further, one embodiment provides that a batch CAM entry can span one, two, three, or more physical CAM entries, and batch CAM entries of varying sizes can be programmed into a single CAM device. Thus, a lookup operation might take two lookup iterations on the physical entries of the CAM device, with a next lookup operation taking a different number of lookup iterations (e.g., one, three or more).

Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. A processing element may be a general processor, task-specific processor, a core of one or more processors, or other co-located, resource-sharing implementation for performing the corresponding processing. The embodiments described hereinafter embody various aspects and configurations, with the figures illustrating exemplary and non-limiting configurations. A computer-readable media and means for performing methods and processing block operations (e.g., a processor and memory or other apparatus configured to perform such operations) are disclosed and are in keeping with the extensible scope and spirit of the embodiments. The term "apparatus" is used consistently herein with its common definition of an appliance or device.

The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC §101 machine statutory class.

One embodiment includes performing one or more of iterations of lookup operations, based on a lookup word, on a plurality of content-addressable memory entries to identify an overall lookup result. In one embodiment, performing these one or more of iterations of lookup operations includes: performing a lookup operation on bits of the lookup word corresponding to the current iteration on the plurality of content-addressable memory entries to identify a native result for each of the plurality of content-addressable memory entries; determining which of the native results correspond to a match and which of the native results correspond to a non-match in the current iteration based on a batch mask vector and also, for a non-first iteration, on a cumulative result vector; and updating the cumulative result vector with said determination of which of the native results correspond to a match and which of the native results correspond to a non-match. In one embodiment, the batch mask vector identifies for each particular entry of the plurality of content-addressable memory entries a lookup iteration to which said particular entry corresponds.

One embodiment includes determining a single highest-priority result from the cumulative result vector. In one embodiment, the overall lookup result is the single highest priority result from the cumulative result vector. One embodiment includes shifting bits within the cumulative result vector by the number of iterations in said one or more of iterations of lookup operations prior to said determining the single highest-priority result from the cumulative result vector.

In one embodiment, the overall lookup result is the contents of the cumulative result vector after all of said iterations of said one or more of iterations of lookup operations have been performed. In one embodiment, said one or more of iterations of lookup operations consist of one lookup iteration. In one embodiment, said one or more of iterations of lookup operations consist of two lookup iterations. In one embodiment, said one or more of iterations of lookup operations comprise at least three lookup iterations. In one embodiment, the method is performed within a single integrated circuit device. In one embodiment, said based on the cumulative result vector includes determining from the cumulative result vector that all iterations of said one or more of iterations of lookup operations prior to the current iteration produced a corresponding match for related entries of the plurality of content-addressable memory entries. One embodiment includes programming related entries contiguously and in an iteration sequence order within the plurality of content-addressable memory entries.

One embodiment includes an apparatus, comprising: a plurality of content-addressable memory entries; a batch mask vector configured to identify for each particular entry of the plurality of content-addressable memory entries a lookup iteration to which said particular entry corresponds; a cumulative result vector configured to maintain a current cumulative snapshot of lookup results of one or more prior lookup iterations on the plurality of content-addressable memory entries; and match logic configured to determine an overall lookup result based on one or more iterations of lookup operations, based on a lookup word, on the plurality of content addressable memory entries. In one embodiment, this configuration to determine the overall lookup result includes: configuration to cause a lookup operation to be performed, based on bits of the lookup word corresponding to the current iteration, on the plurality of content-addressable memory entries to identify a native result for each of the plurality of content-addressable memory entries; configuration to determine which of the native results correspond to a match and which of the native results correspond to a non-match in the current iteration based on a batch mask vector and also, for a non-first iteration, on the cumulative result vector; and configuration to update the cumulative result vector with said determination of which of the native results correspond to a match and which of the native results correspond to a non-match.

One embodiment includes a priority encoder configured to determine a single highest-priority result from the cumulative result vector; wherein the overall lookup result is the single highest priority result from the cumulative result vector. In one embodiment, the cumulative result vector is configured to shift bits by the number of iterations in said one or more of iterations of lookup operations. In one embodiment, said one or more of iterations of lookup operations consist of one lookup iteration. In one embodiment, said one or more of iterations of lookup operations consist of two lookup iterations. In one embodiment, said one or more of iterations of lookup operations comprise at least three lookup iterations. In one embodiment, the apparatus is a single integrated circuit device. In one embodiment, said based on the cumulative result vector includes determining from the cumulative result vector that all iterations of said one or more of iterations of lookup operations prior to the current iteration produced a corresponding match for related entries of the plurality of content-addressable memory entries. In one embodiment, related entries are stored contiguously and in an iteration sequence order within the plurality of content-addressable memory entries.

Expressly turning to the figures, FIG. 1A illustrates content-addressable memory (CAM) entries 100. In one embodiment, CAM entries are binary CAM entries. In one embodiment, CAM entries are ternary CAM entries. In one embodiment, CAM entries are quaternary CAM entries. A common width of a CAM entry is 80 bits. So, for illustrative purposes, FIG. 1A uses a CAM entry width of 80 bits.

The shown nine CAM entries 100 are programmed into three batch entries 101, 102, and 103. Batch entry A 101 consists of three CAM entries 100; batch entry B 102 consists of two CAM entries 100; and batch entry C 103 consists of five CAM entries 100. Thus, this technique allows batch entries of different widths to be programmed into a same set of CAM entries. As shown, up to eighty bits are programmed into each CAM entry 100 of batch entries 101, 102, and 103.

Batch mask vector (BMV) 110 is a separate memory (e.g., register(s), random access memory, non-associative memory) that includes a value corresponding to each of CAM entries 100. BMV 110 includes data to identify whether a corresponding CAM entry 100 is a start entry (encoded as binary '10' in one embodiment); middle entry (encoded as binary '00' in one embodiment); an end entry (encoded as binary '11' in one embodiment); or a batch entry consisting of a single CAM entry (encoded as binary '01' in one embodiment). Each of batch entries 101, 102, 103 include a start entry and an end entry. Each of batch entries 101 and 103 include a middle entry. Batch entry 102 does not include a middle entry as it consists of two CAM entries 100. A batch entry consisting of a single CAM entry 100 is typically marked as a start entry. In embodiment, a start entry corresponds to the high-order bits of a batch entry and an end entry corresponds to the low-order bits of a batch entry. In one embodiment, a start entry corresponds to the low-order bits of a batch entry and an end entry corresponds to the high-order bits of a batch entry.

Figure 1B:
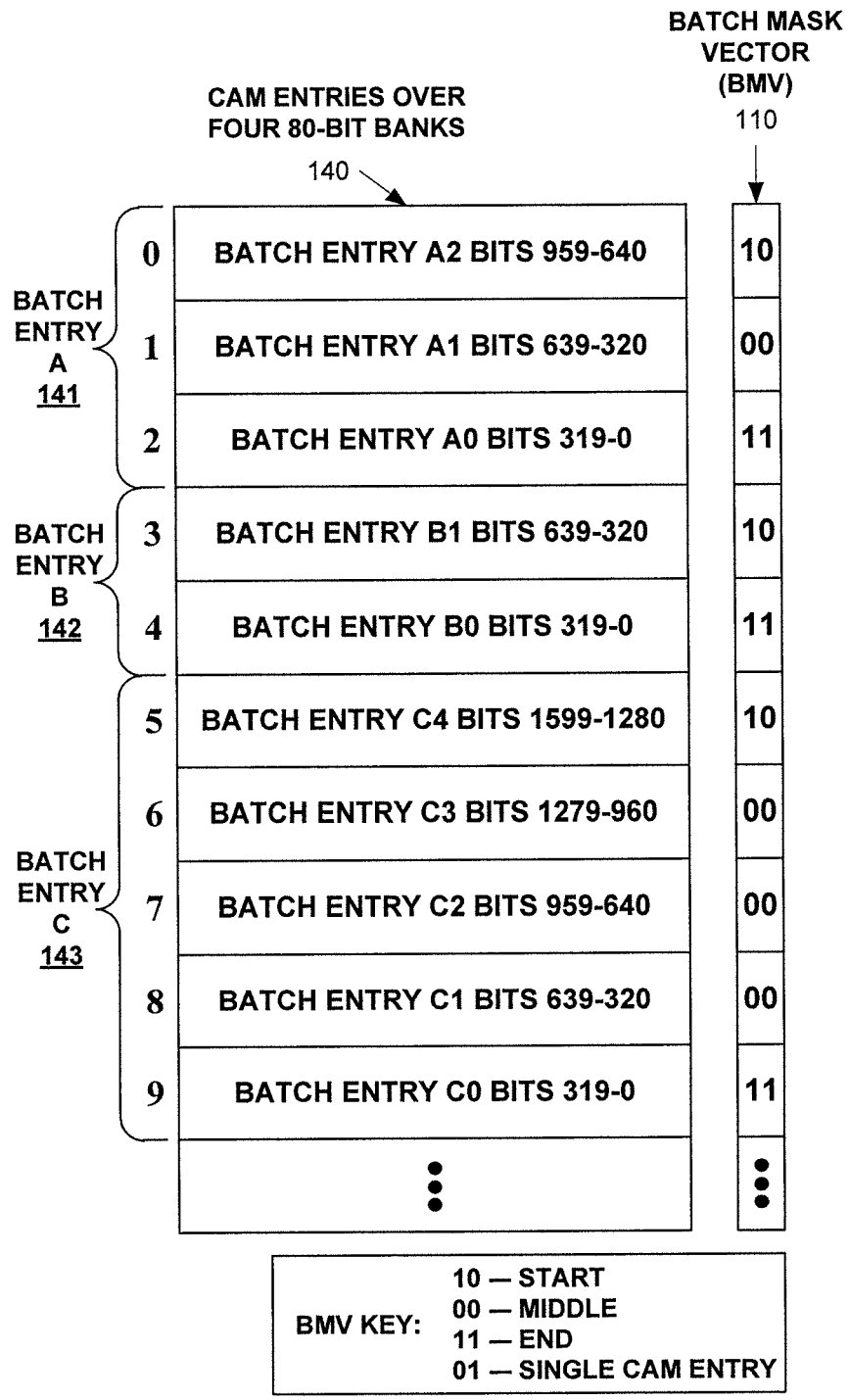
FIG. 1B illustrates content-addressable memory entries according to one embodiment.

FIG. 1B is similar to FIG. 1A, and is included herein to expressly illustrate that CAM entries 140 can be striped across multiple CAM banks to achieve wider CAM entries 140. In this example, each of CAM entries 140 is four times eight bits wide, which equals three hundred-twenty bits wide. In one embodiment, batch entries 141, 142, and 143 are programmed in a same manner as described in relation to batch entries 101, 102, and 103 of FIG. 1A. BMV 110 is the same in FIGS. 1A and 1B.

Figure 2:
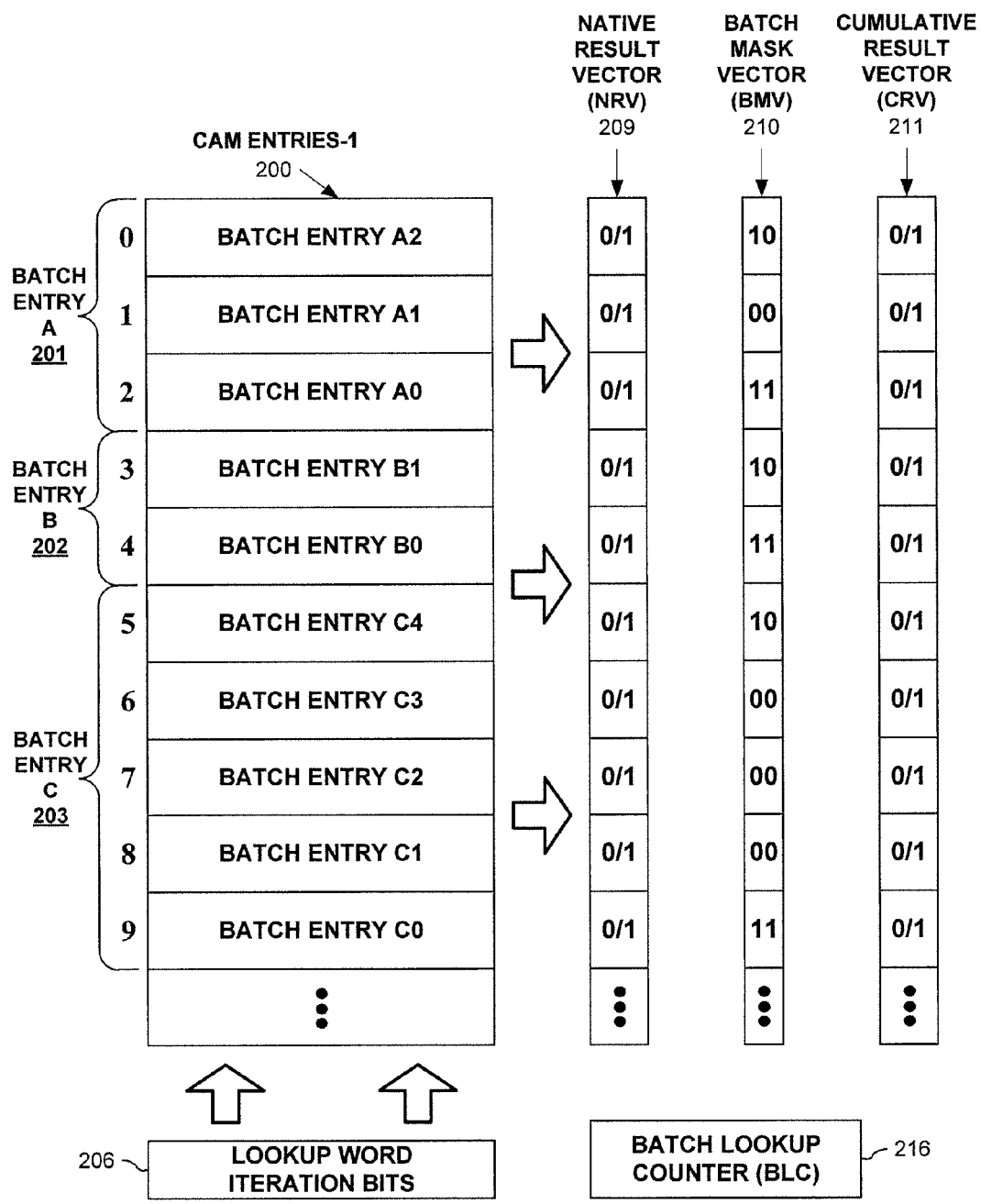
FIG. 2 illustrates performing iterative content-addressable memory lookup operations according to one embodiment.

FIG. 2 illustrates CAM entries 200 programmed as batch entries 201, 202, and 203. Batch mask vector (BMV) 210 is programmed to describe the function of CAM entries 200 in batch entries 201, 202, and 203. By having BMV 210 be distinct from CAM entries 200, the information represented in BMV 210 does not consume any bits of CAM entries 200.

For each lookup iteration, the matching results of each CAM entry 200 is captured in native result vector (NRV) 209. In one embodiment, a one represents a match (e.g., hit), and a zero represents not a match (e.g., a miss). One embodiment uses a different representation, with logic computations performed accordingly. Cumulative result vector (CRV) 211 is used to aggregate the results over each iteration.

In one embodiment, if the lookup operation is to consist of a single iteration, then a single lookup operation is performed with the lookup word matched against each of CAM entries 200, with the individual matching results of each CAM entry 200 captured in native result vector (NRV) 209. The results in NVR 209 are filtered by control logic based on batch mask vector (BMV) 210 to consider any matching indication in NVR 209 that is not marked as a batch entry consisting of a single CAM entry in BMV 210 to be a miss. The result of this filtering is captured in cumulative result vector (CRV) 211. Because a lookup operation on CAM entries 200 is being performed using a single lookup iteration, then CRV 211 contains the matches, and typically, a priority encoder is used to identify a single highest-priority matching entry identified in CRY 211, or a miss if there are no matching entries identified in CRV 211.

Otherwise, the desired matching batch entry spans multiple CAM entries 200. In one embodiment, to perform a series of lookup operation on batch entries 201, 202, and 203, a batch lookup counter (BLC) 216 is set to the number of iterations to be performed in the iterative lookup operation. The number of lookup iterations is typically determined from the width of the batch lookup word divided by the width of each of CAM entries 200.

For a first lookup iteration, corresponding bits of the lookup word 206 for the first iteration are matched against each of CAM entries 200, with the individual matching results of each CAM entry 200 captured in native result vector (NRV) 209.

In one embodiment, the entire lookup word having a width spanning multiple lookup iterations is initially received with different portions used for each iteration. In one embodiment, different bits/portions of a lookup word are received in sequence, one for lookup iteration.

The results in NVR 209 are filtered by control logic based on batch mask vector (BMV) 210 to consider any matching indication in NVR 209 that is not marked as a start entry in BMV 210 to be a miss. The result of this filtering is captured in cumulative result vector (CRY) 211.

Batch lookup counter (BLC) 216 is decremented by one to reflect that one less lookup iteration remains to be performed.

If the lookup operation is seeking a batch entry of more than two CAM entries 200, then one or more iterations for identifying matching with middle entries is performed; otherwise processing continues to look for an end entry as described supra.

For each middle entry sought, a lookup operation on each of CAM entries 200 is performed on a corresponding set of bits of the lookup word (206), with the individual matching results of each CAM entry 200 captured in native result vector (NRV) 209. Cumulative result vector (CRV) 211 is then updated to reflect current snapshot of the aggregation of matches. CRV 211 will indicate a hit only in all positions within CRV 211 where:
1. a corresponding CAM entry 200 matched the lookup word portion 206 (e.g., matching results reflected in NRV 209);
2. BMV indicates that this corresponding CAM entry 200 was a middle entry; and
3. CRV 211 reflects that the start entry and previous middle entries, if any, of the batch entry including this corresponding CAM entry 200 matched correctly at each previous iteration.

Batch lookup counter (BLC) 216 is decremented by one to reflect that one less lookup iteration remains to be performed.

When BLC 216 reflects that there is one final iteration to be performed (e.g., for matching on CAM entries 200 marked in BMV 210 as being an end entry), a lookup operation on each of CAM entries 200 is performed on a corresponding last set of bits of the lookup word (206), with the individual matching results of each CAM entry 200 captured in native result vector (NRV) 209. Cumulative result vector (CRV) 211 is then updated to reflect current snapshot of the aggregation of matches. CRV 211 will indicate a hit only in all positions within CRV 211 where:
1. a corresponding CAM entry 200 matched the lookup word portion 206 (e.g., matching results reflected in NRV 209);
2. BMV indicates that this corresponding CAM entry 200 was an end entry; and
3. CRV 211 reflects that the start entry and previous middle entries, if any, of the batch entry including this corresponding CAM entry 200 matched correctly at each previous iteration.

In one embodiment, CRV 211 is provided as the lookup result. In one embodiment, the results of CRV 211 are shifted up by the number of iterations so that the matching or no match indication of the batch entry (201-203) aligns with the first CAM entry 200 of a batch entry (201-203). In one embodiment, a priority encoder is used to find a single highest-priority matching batch entry reflected in CRV 211.

Figure 3A:
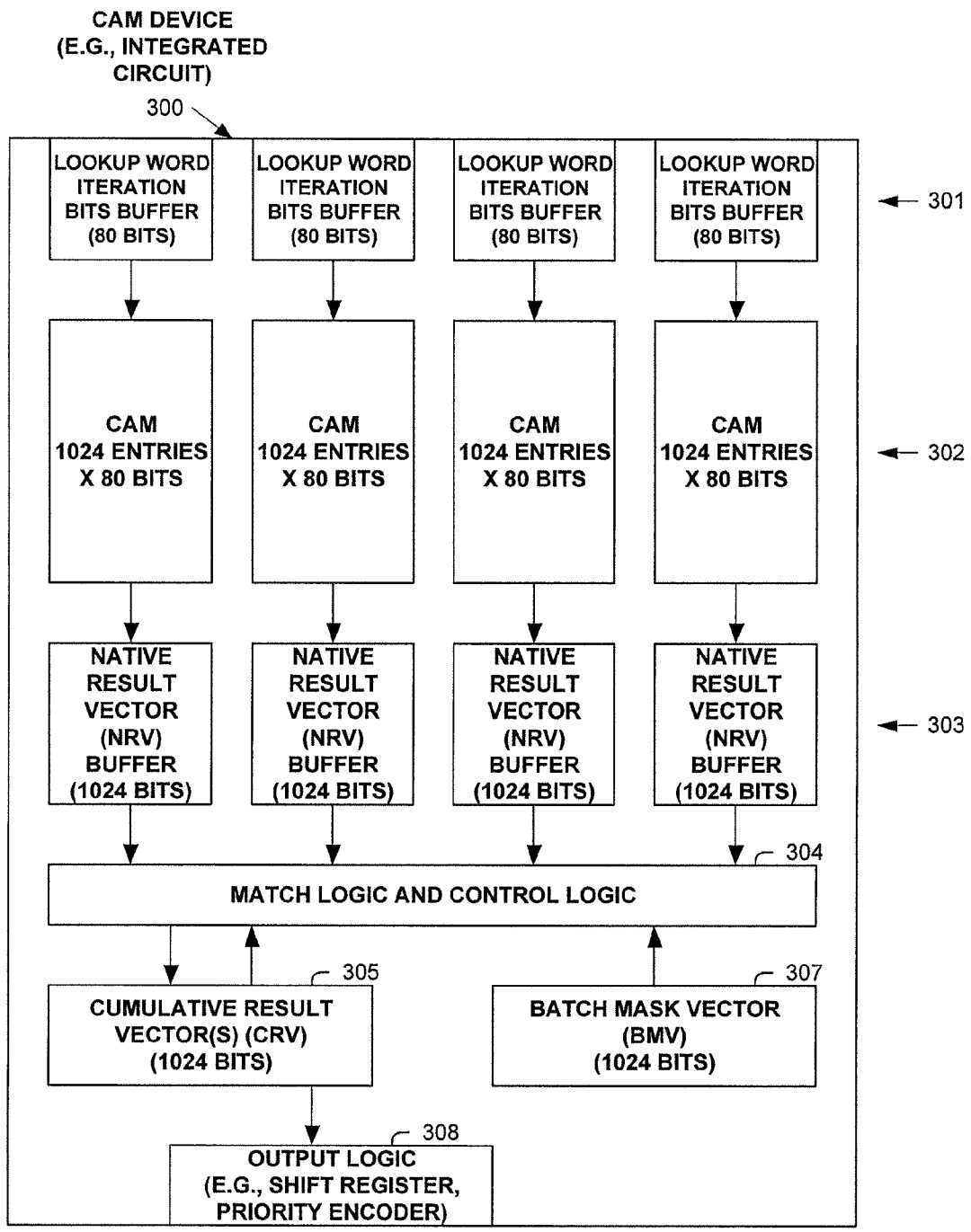
FIG. 3A illustrates an apparatus according to one embodiment.

FIG. 3A illustrates one embodiment of CAM device 300 (e.g., apparatus, appliance, integrated circuit), which includes: lookup word iteration bit buffers 301, CAM entries 302, native result vectors 303, match and control logic 304, cumulative result vector (CRV) 305, batch mask vector (BMV) 307, and output logic 308 (e.g., shift register, priority encoder). Some of the data flows of CAM device 300 are illustrated in FIG. 3A. Control signals are not shown but are provided where needed. For illustrative purposes, numeric dimensions of one embodiment are presented in FIG. 3A. Of course, one embodiment has other numeric dimensions. The operation of CAM device 300 is described herein, such as that described in relation to FIG. 2 and in relation to FIG. 4.

In one embodiment, such as that illustrated in FIG. 3A, it is possible that the lookup word for a current iteration is less than the full width of a possible lookup operation. For example, there are each of the illustrated four lookup word iteration bits buffer 310 are 80 bits wide, which correspond to the width of each entry of each CAM bank 302. In one embodiment, a lookup operation is selectively performed on entries in one, two, three or all four of CAM banks 302. Thus, each iteration on bits of a lookup word operation may be performed on a different number of bits. For example, a lookup word of width 800 bits may cause three lookup word iteration bit widths of 320 bits (i.e., lookup on all four banks 302), 320 bits (i.e., lookup on all four banks 302), and 160 bits (e.g., only lookup on a selected two of the four banks 302). The order of these iterations corresponds to the programming of the entries in CAM banks 320 (e.g., CAM entries programmed in widths of 320 bits, 320 bits, and 160 bits). In one embodiment, the width of a current lookup word is different than a multiple of the width of a CAM bank 302 (but this is a more complicated implementation than that using a single enable line for each CAM bank 302).

Figure 3B:
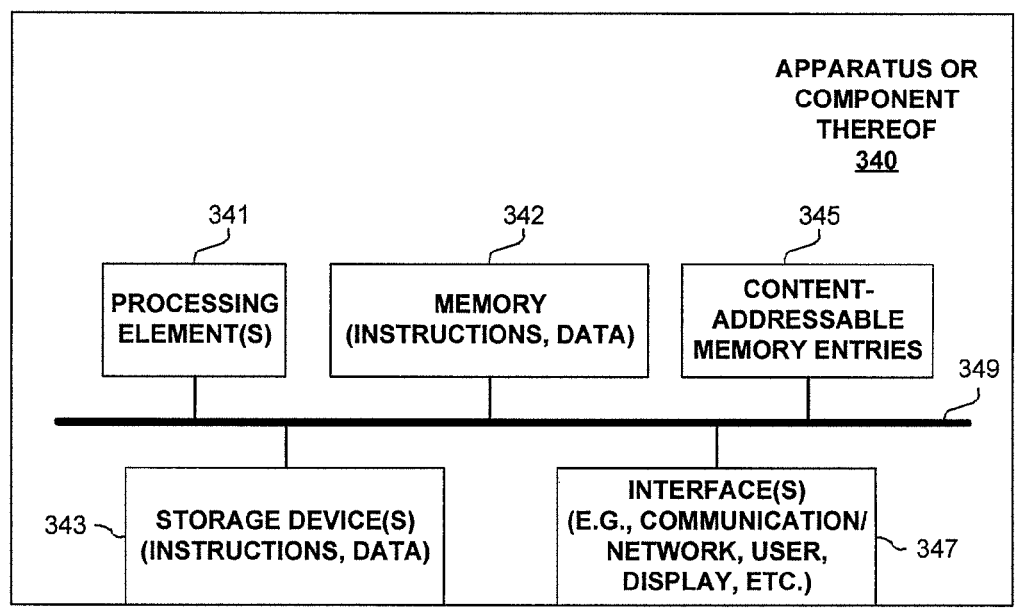
FIG. 3B illustrates an apparatus, or component thereof, according to one embodiment.

FIG. 3B is a block diagram of an apparatus 340 used in one embodiment associated with content-addressable memory lookup device supporting iterative lookup operations. In one embodiment, apparatus 340 determines and/or programs content-addressable entries, and/or performs one or more processes, or portions thereof, corresponding to one of the flow diagrams illustrated or otherwise described herein, and/or illustrated in another diagram or otherwise described herein.

In one embodiment, apparatus 340 includes one or more processing element(s) 341, memory 342, storage device(s) 343, content-addressable memory entries 345, and interface(s) 347 for communicating information (e.g., signaling lookup results, sending and receiving packets, user-interfaces, displaying information, etc.), which are typically communicatively coupled via one or more communications mechanisms 349, with the communications paths typically tailored to meet the needs of a particular application. In one embodiment, processing elements 341 and memory 342 are used to maintain and process batch mask vector, native result vector, and cumulative result vector data structures, and to control iterative lookup operations on content-addressable memory entries 345 to produce an overall lookup operation result as described herein (e.g., especially in relation to FIG. 2 and/or FIG. 4).

Various embodiments of apparatus 340 may include more or fewer elements. The operation of apparatus 340 is typically controlled by processing element(s) 341 using memory 342 and storage device(s) 343 to perform one or more tasks or processes. Memory 342 is one type of computer-readable/computer-storage medium, and typically comprises random access memory (RAM), read only memory (ROM), flash memory, integrated circuits, and/or other memory components. Memory 342 typically stores computer-executable instructions to be executed by processing element(s) 341 and/or data which is manipulated by processing element(s) 341 for implementing functionality in accordance with an embodiment. Storage device(s) 343 are another type of computer-readable medium, and typically comprise solid state storage media, disk drives, diskettes, networked services, tape drives, and other storage devices. Storage device(s) 343 typically store computer-executable instructions to be executed by processing element(s) 341 and/or data which is manipulated by processing element(s) 341 for implementing functionality in accordance with an embodiment.

Figure 4:
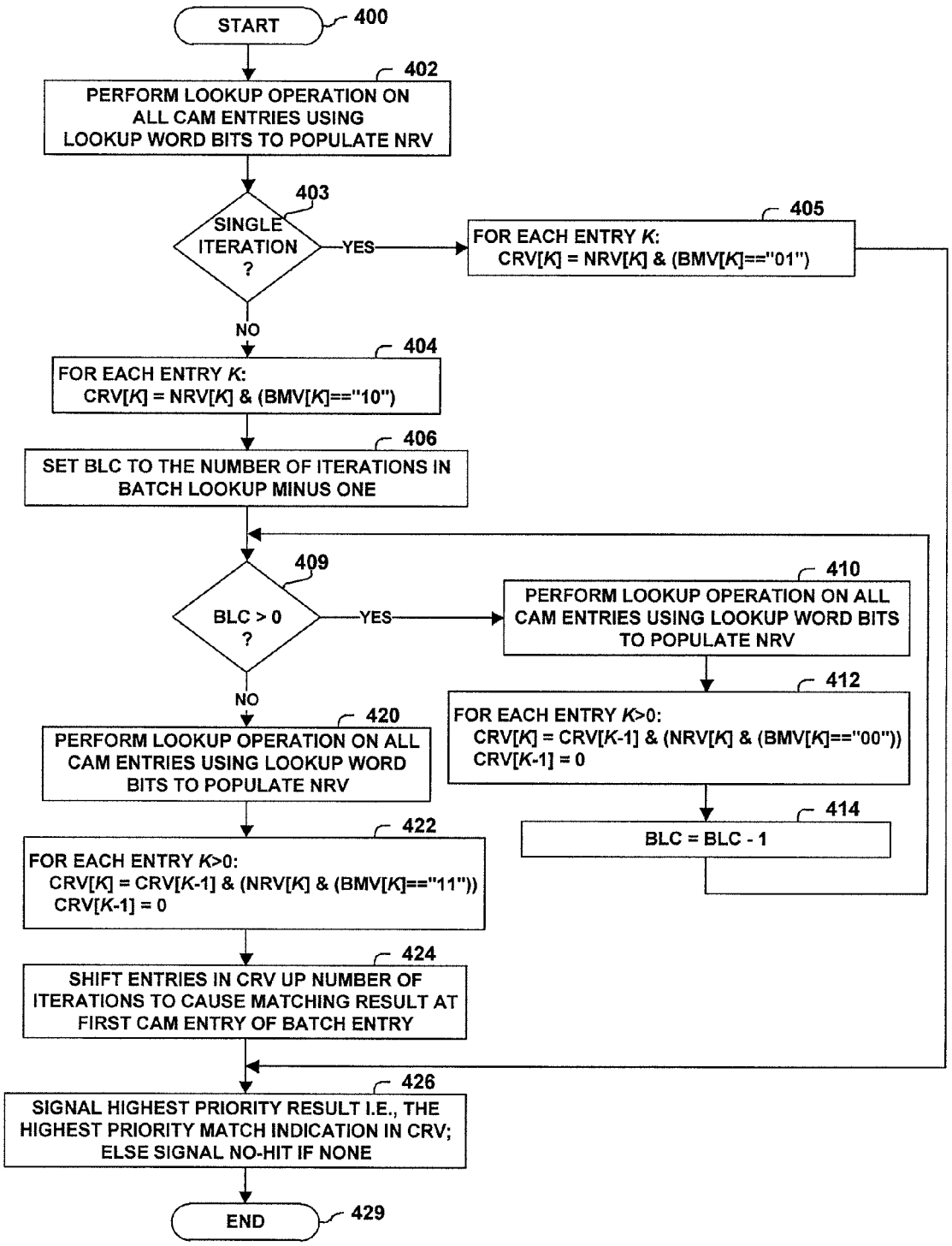
FIG. 4 illustrates a process according to one embodiment.

FIG. 4 illustrates a process performed in one embodiment. The previous discussion and figures, especially FIGS. 2 and 3A, provide a good backdrop for the discussion of the process described in FIG. 4.

Processing of the flow diagram of FIG. 4 begins with process block 400. In process block 402, a lookup operation is performed on all CAM entries using corresponding bits of the overall lookup word to generate matching results stored in a native result vector (NVR).

As determined in process block 403, if the batch lookup operation consists of a single iteration, then in process block 404, for each entry K of the CAM entries (e.g., sequence through the CAM entries with K ranging from zero to one less than the number of CAM entries), the entry K in cumulative result vector (CMV) is marked as a one ('1') to indicate a match (e.g., hit) where entry K in NVR indicates a match and entry K in batch mask vector (BMV) indicates a batch entry consisting of a single CAM entry (e.g., '01'); else entry K in CMV is marked as a zero ('0') to indicate no match (e.g., miss). Processing then proceeds to process block 426, wherein the highest priority result in CRV is signaled as the overall matching result (if no match, then this result is no match). Processing of the flow diagram of FIG. 4 is complete as indicated by process block 429.

Otherwise, in process block 404, for each entry K of the CAM entries (e.g., sequence through the CAM entries with K ranging from zero to one less than the number of CAM entries), the entry K in cumulative result vector (CMV) is marked as a one ('1') to indicate a match (e.g., hit) where entry K in NVR indicates a match and entry K in batch mask vector (BMV) indicates a start batch entry (e.g., '10'); else entry K in CMV is marked as a zero ('0') to indicate no match (e.g., miss).

Otherwise, as determined in process block 405, the batch lookup operation comprises at least two iterations, and processing proceeds to process block 406, wherein the batch lookup counter is set to the number of iterations in this batch lookup operation minus one.

Process block 409 determines whether the current iteration is to seek matching middle entries (process blocks 410-416) or to complete the lookup operation by seeking matching end entries and to signal the overall matching result (process blocks 420-429).

When determined in process block 409 to seek a middle entry in this iterative lookup operation, in process block 410, a lookup operation is performed on all CAM entries using corresponding lookup word bits to generate matching results stored in a native result vector (NVR). In process block 412, for each entry K>0 of the CAM entries (e.g., sequence through the CAM entries with K ranging from one to one less than the number of CAM entries), the entry K in cumulative result vector (CMV) is marked as a one ('1') to indicate a match (e.g., hit) where entry K in NVR indicates a match, entry K in batch mask vector (BMV) indicates a middle batch entry (e.g., '00'), and the entry K−1 in CMV indicates a match, else entry K in CMV is marked as a zero ('0') to indicate no match (e.g., miss); and also the entry K−1 in CMV is set to zero, as the relevant matching position is K in CMV, and the result of a previous iteration needs to be marked as not a hit to avoid detecting an incorrect hit of a batch entry by a priority encoder in process block 426. In one embodiment, bit shifting is used to implement the arithmetic to find a previous entry (e.g., K−1 in CMV). Requiring that the previous entry in CMV indicates a match for determining a current match imposes a restriction that all previous iterations (e.g., matching a start entry, and matching all previous middle entries if any) determined to be a match for the corresponding batch entry programmed into consecutive CAM entries. In process block 414, the batch loop counter (BLC) is reduced by one (e.g., one less iteration remaining to be performed). Processing returns to process block 409.

When determined in process block 409 to seek an end entry in this iterative lookup operation, in process block 420, a lookup operation is performed on all CAM entries using corresponding lookup word bits to generate matching results stored in a native result vector (NVR). In process block 422, for each entry K>0 of the CAM entries (e.g., sequence through the CAM entries with K ranging from one to one less than the number of CAM entries), the entry K in cumulative result vector (CMV) is marked as a one ('1') to indicate a match (e.g., hit) where entry K in NVR indicates a match, entry K in batch mask vector (BMV) indicates an end batch entry (e.g., '11'), and the entry K−1 in CMV indicates a match; else entry K in CMV is marked as a zero ('0') to indicate no match (e.g., miss); and also the entry K−1 in CMV is set to zero, as the relevant matching position is K in CMV, and the result of a previous iteration needs to be marked as not a hit to avoid detecting an incorrect hit of a batch entry by a priority encoder in process block 426. In one embodiment, bit shifting is used to implement the arithmetic to find a previous entry (e.g., K−1 in CMV). Requiring that the previous entry in CMV indicates a match for determining a current match imposes a restriction that all previous iterations (e.g., matching a start entry, and matching all previous middle entries if any) determined to be a match for the corresponding batch entry programmed into consecutive CAM entries. In process block 424, all entries in the cumulative result vector (CMV) are shifted up (with zeros/no hit bits shifted in) by the number of lookup operations in the current batch lookup in order cause the matching result to be indicated at the start entry of each matching batch entry. In process block 426, the highest priority result in CRV is signaled as the overall matching result (if no match, then this result is no match). Processing of the flow diagram of FIG. 4 is complete as indicated by process block 429.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. A method, comprising:
performing a plurality of iterations of lookup operations, based on a lookup word, on a plurality of content-addressable memory entries to identify an overall lookup result, including:
performing a lookup operation on bits of the lookup word corresponding to a current iteration of said lookup operations on the plurality of content-addressable memory entries to identify a native result for each of the plurality of content-addressable memory entries; and
determining which of the native results correspond to a match and which of the native results correspond to a non-match in the current iteration based on a batch mask vector and also, for a non-first iteration, on cumulative results of previous iterations of said lookup operations;
wherein the batch mask vector identifies for each particular entry of the plurality of content-addressable memory entries a lookup iteration to which said particular entry corresponds.

2. A method, comprising:
  performing one or more of iterations of lookup operations, based on a lookup word, on a plurality of content-addressable memory entries to identify an overall lookup result, including:
    performing a lookup operation on bits of the lookup word corresponding to a current iteration of said lookup operations on the plurality of content-addressable memory entries to identify a native result for each of the plurality of content-addressable memory entries; and
    updating a cumulative result vector with which of the native results correspond to a match and which of the native results correspond to a non-match in the current iteration based on a batch mask vector and also, for a non-first iteration, on the cumulative result vector;
  wherein the batch mask vector identifies for each particular entry of the plurality of content-addressable memory entries a lookup iteration to which said particular entry corresponds.

3. The method of claim 2, comprising: determining a single highest-priority result from the cumulative result vector; wherein the overall lookup result is the single highest-priority result from the cumulative result vector.

4. The method of claim 3, comprising: shifting bits within the cumulative result vector by the number of iterations in said one or more of iterations of lookup operations prior to said determining the single highest-priority result from the cumulative result vector.

5. The method of claim 2, wherein the overall lookup result is the contents of the cumulative result vector after all of said iterations of said one or more of iterations of lookup operations have been performed.

6. The method of claim 2, wherein said one or more of iterations of lookup operations consist of one lookup iteration.

7. The method of claim 2, wherein said one or more of iterations of lookup operations consist of two lookup iterations.

8. The method of claim 2, wherein said one or more of iterations of lookup operations comprise at least three lookup iterations.

9. The method of claim 2, wherein the method is performed within a single integrated circuit device.

10. The method of claim 2, wherein said based on the cumulative result vector includes determining from the cumulative result vector that all iterations of said one or more of iterations of lookup operations prior to the current iteration produced a corresponding match for related entries of the plurality of content-addressable memory entries.

11. The method of claim 10, comprising: programming related entries contiguously and in an iteration sequence order within the plurality of content-addressable memory entries.

12. An apparatus, comprising:
  one or more content-addressable memories configured to store a plurality of content-addressable memory entries;
  memory configured to store a batch mask vector identifying for each particular entry of the plurality of content-addressable memory entries a lookup iteration to which said particular entry corresponds;
  memory configured to store a cumulative result vector maintaining a current cumulative snapshot of lookup results of one or more prior lookup iterations on the plurality of content-addressable memory entries; and
  hardware match logic configured to determine an overall lookup result based on one or more iterations of lookup operations, based on a lookup word, on the plurality of content-addressable memory entries; wherein said configuration to determine the overall lookup result includes:
    configuration to cause a lookup operation to be performed, based on bits of the lookup word corresponding to a current iteration, on the plurality of content-addressable memory entries to identify a native result for each of the plurality of content-addressable memory entries;
    configuration to determine which of the native results correspond to a match and which of the native results correspond to a non-match in the current iteration based on a batch mask vector and also, for a non-first iteration, on the cumulative result vector; and
    configuration to update the cumulative result vector with said determination of which of the native results correspond to a match and which of the native results correspond to a non-match.

13. The apparatus of claim 12, comprising: a priority encoder configured to determine a single highest-priority result from the cumulative result vector; wherein the overall lookup result is the single highest-priority result from the cumulative result vector.

14. The apparatus of claim 13, comprising: wherein the cumulative result vector is configured to shift bits by the number of iterations in said one or more of iterations of lookup operations.

15. The apparatus of claim 12, wherein said one or more of iterations of lookup operations consist of one lookup iteration.

16. The apparatus of claim 12, wherein said one or more of iterations of lookup operations consist of two lookup iterations.

17. The apparatus of claim 12, wherein said one or more of iterations of lookup operations comprise at least three lookup iterations.

18. The apparatus of claim 12, wherein the apparatus is a single integrated circuit device.

19. The apparatus of claim 12, wherein said based on the cumulative result vector includes determining from the cumulative result vector that all iterations of said one or more of iterations of lookup operations prior to the current iteration produced a corresponding match for related entries of the plurality of content-addressable memory entries.

20. The apparatus of claim 19, wherein related entries are stored contiguously and in an iteration sequence order within the plurality of content-addressable memory entries.

* * * * *

UNITED STATES PATENT AND TRADEMARK OFFICE
CERTIFICATE OF CORRECTION

PATENT NO. : 8,904,101 B2  
APPLICATION NO. : 13/594827  
DATED : December 2, 2014  
INVENTOR(S) : Shoham et al.

It is certified that error appears in the above-identified patent and that said Letters Patent is hereby corrected as shown below:

In the Specification

Col. 6, line 41, replace "CRY 211," with -- CRV 211, --

Col. 6, line 65, replace "(CRY) 211" with -- (CRV) 211 --

Signed and Sealed this  
Twenty-fifth Day of August, 2015

Michelle K. Lee  
*Director of the United States Patent and Trademark Office*